(12) United States Patent
Weimer

(10) Patent No.: US 7,247,920 B2
(45) Date of Patent: Jul. 24, 2007

(54) METHOD OF COMPOSITE GATE FORMATION

(75) Inventor: Ronald A. Weimer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/931,840

(22) Filed: Sep. 1, 2004

(65) Prior Publication Data

US 2005/0026348 A1 Feb. 3, 2005

Related U.S. Application Data

(62) Division of application No. 10/236,841, filed on Sep. 6, 2002, which is a division of application No. 09/935,255, filed on Aug. 22, 2001.

(51) Int. Cl.
*H01L 29/76* (2006.01)
(52) U.S. Cl. .................................. 257/411; 257/406
(58) Field of Classification Search ............... 257/313, 257/411, 406; 438/287
See application file for complete search history.

(56) References Cited

U.S. PATENT DOCUMENTS

| | | | |
|---|---|---|---|
| 5,138,401 A | 8/1992 | Yamazaki ............... 505/191 |
| 5,563,093 A | 10/1996 | Koda et al. ............. 438/231 |
| 5,634,974 A | 6/1997 | Weimer et al. .......... 117/103 |
| 5,759,262 A | 6/1998 | Weimer et al. ........... 117/88 |
| 5,923,999 A * | 7/1999 | Balasubramanyam et al. ..................... 438/592 |
| 6,005,807 A | 12/1999 | Chen ................. 365/185.26 |
| 6,087,229 A | 7/2000 | Aronowitz et al. ...... 438/591 |
| 6,127,287 A | 10/2000 | Hurley et al. ........... 438/791 |
| 6,203,613 B1 | 3/2001 | Gates et al. ............. 117/104 |
| 6,204,206 B1 | 3/2001 | Hurley .................. 438/791 |
| 6,228,779 B1 | 5/2001 | Bloom et al. ............ 438/763 |
| 6,245,689 B1 | 6/2001 | Hao et al. ............... 438/769 |
| 6,291,868 B1 | 9/2001 | Weimer et al. .......... 257/413 |
| 6,297,095 B1 | 10/2001 | Muralidhar et al. ..... 438/257 |
| 6,323,114 B1 | 11/2001 | Hattangady et al. ..... 438/591 |
| 6,362,086 B2 | 3/2002 | Weimer et al. .......... 438/591 |
| 6,410,968 B1 | 6/2002 | Powell et al. ........... 257/412 |
| 6,475,883 B2 | 11/2002 | Powell et al. ........... 438/486 |
| 6,531,364 B1 | 3/2003 | Gardner et al. ......... 438/287 |
| 6,544,908 B1 | 4/2003 | Weimer et al. .......... 438/798 |
| 6,559,007 B1 | 5/2003 | Weimer ................. 438/257 |
| 6,596,595 B1 | 7/2003 | Weimer et al. .......... 438/287 |
| 6,815,805 B2 | 11/2004 | Weimer ................. 257/629 |
| 2001/0014522 A1 | 8/2001 | Weimer et al. .......... 438/591 |
| 2002/0025658 A1 | 2/2002 | Powell et al. ........... 438/486 |
| 2002/0060348 A1 | 5/2002 | Powell et al. ........... 257/412 |

OTHER PUBLICATIONS

Wolf, Silicon Processing for the VLSI Era, vol. 2—Process Integration, Lattice Press: Sunset Beach CA, 1990, pp. 332-335.

\* cited by examiner

*Primary Examiner*—Douglas M. Menz
(74) *Attorney, Agent, or Firm*—Whyte Hirschboeck Dudek SC

(57) ABSTRACT

Methods for forming a nitride barrier film layer in semiconductor devices such as gate structures, and barrier layers, semiconductor devices and gate electrodes are provided. The nitride layer is particularly useful as a barrier to boron diffusion into an oxide film. The nitride barrier layer is formed by selectively depositing silicon onto an oxide substrate as a thin layer, and then thermally annealing the silicon layer in a nitrogen-containing species or exposing the silicon to a plasma source of nitrogen to nitridize the silicon layer.

27 Claims, 2 Drawing Sheets

METHOD OF COMPOSITE GATE FORMATION

CROSS REFERENCE TO RELATED APPLICATION

This application is a division of U.S. patent application Ser. No. 10/236,841, filed Sep. 6, 2002, currently pending, which is a division of U.S. patent application Ser. No. 09/935,255, filed Aug. 22, 2001, currently pending.

FIELD OF THE INVENTION

The present invention relates generally to semiconductor fabrication and, more particularly, to methods of forming nitride barrier layers used in semiconductor devices.

BACKGROUND OF THE INVENTION

Metal-insulator-silicon (MIS) transistors, including metal-oxide-silicon (MOS) transistors, are comprised of doped source and drain regions formed in the surface of a semiconductor substrate, a channel region between the source and drain, and a gate electrode situated over the channel region. The gate electrode is physically and electrically separated from the channel by a thin gate dielectric (oxide) layer, typically silicon dioxide. The gate electrode typically comprises a doped polysilicon material. Diffusion of dopants such as boron from the doped polysilicon gate through the gate oxide layer into the underlying silicon substrate poses serious problems in processing and the functioning of the device.

To inhibit boron diffusion, nitrogen has been incorporated into the gate oxide layer. One conventional method of incorporating nitrogen into the oxide layer is by anneal of the oxide layer in nitric oxide (NO), nitrous oxide ($N_2O$), ammonia ($NH_3$) or other nitrogen-containing species. However, thermal nitridation of the gate oxide layer results in nitrogen incorporation at the silicon/oxide interface, which increases the ability of the gate oxide layer to suppress boron penetration but can result in transconductance loss.

Another method of forming a nitrided gate oxide layer is by remote plasma nitridation by exposing the surface of the oxide layer to a plasma generated species of nitrogen. This results in the polysilicon/oxide interface being nitridized as opposed to the gate oxide/silicon interface, thus avoiding transconductance loss. However, data indicates that the plasma nitridation may not be scaleable below 25 angstroms for integrated circuit (IC) devices with high processing thermal budgets such as DRAMS or flash devices due to the loss of integrity of the gate oxide as well as the loss of transconductance due to the proximity of nitrogen to the gate oxide-silicon interface.

Another conventional method to incorporate nitrogen into the gate oxide layer is to form a composite gate dielectric layer comprising a silicon nitride layer and an oxide layer. An issue with forming such a composite gate oxide is that the interface between the silicon nitride and oxide layers typically requires rigorous post-treatment processing to eliminate potential sources of charge trapping. In addition, composite gate dielectrics that comprise nitride and thermal oxides have limitations due to the total effective oxide thickness that can be achieved due to poor nucleation of nitride on oxide. This requires the formation of a relatively thick nitride layer resulting in an overall effective oxide thickness that is higher than that which is considered as usable.

Thus, a need exists for a nitride barrier layer that avoids such problems.

SUMMARY OF THE INVENTION

The present invention provides methods for forming a nitride barrier film layer useful in fabrication of semiconductor devices such as gate structures. The nitride layer is particularly useful as a barrier to boron diffusion into an oxide film.

In one aspect, the invention provides methods for forming a nitride barrier layer over a dielectric (oxide) substrate. The dielectric layer is exposed to a silicon-containing species under low partial pressure, high vacuum to nucleate the surface of the dielectric layer and deposit a thin layer of silicon, which is then exposed to a nitrogen-containing species to nitridize the silicon and form a silicon nitride barrier layer. The silicon-containing species can be deposited, for example, by plasma enhanced chemical vapor deposition, low pressure chemical vapor deposition, rapid thermal chemical vapor deposition, among other processes. The silicon layer can comprise polysilicon or amorphous silicon. In an embodiment of the method, an oxide layer is irradiated with a silicon-containing species at a low partial pressure of about $10^{-2}$ Torr (10 mTorr) or less to selectively deposit a thin layer of silicon onto the oxide surface, preferably about 10 to about 20 angstroms thick. The silicon layer can then be thermally annealed in a nitrogen-containing species at a preferred temperature of about 700° C. to about 900° C., or exposed to a plasma source of nitrogen to nitridize the silicon. The plasma nitrogen can be produced, for example, by a downstream microwave system, an electron cyclotron residence system, an inductive coupled plasma system, a radio frequency (RF) system, among others.

In another aspect, the invention provides methods for forming a semiconductor device. In one embodiment, the method comprises exposing a dielectric layer disposed on a silicon substrate to a silicon-containing species under a low partial pressure of about $10^{-2}$ Torr or less, and a flow rate of less than 100 sccm to deposit a layer of about 10 to about 20 angstroms silicon; and exposing the silicon layer to a nitrogen-containing species to nitridize the silicon and form a silicon nitride barrier layer. The silicon layer can be thermally annealed in a nitrogen-containing species, preferably at a temperature of about 700° C. to about 900° C., or exposed to a plasma source of a nitrogen-containing species.

In another aspect, the invention provides methods for forming a gate electrode. In one embodiment, the method comprises exposing a gate oxide (dielectric) layer disposed on a silicon substrate to a silicon-containing species at a low partial pressure of about $10^{-2}$ Torr or less to deposit a layer of about 10 to about 20 angstroms silicon; and exposing the silicon layer to a nitrogen-containing species to form a silicon nitride barrier layer. In one embodiment, the silicon layer can be thermally annealed in a nitrogen-containing species, preferably at a temperature of about 700° C. to about 900° C. In another embodiment, the silicon layer can be exposed to a plasma source of nitrogen. The method can further comprise forming a conductive polysilicon layer comprising a boron dopant over the nitride barrier layer, and additional layers as desired including, for example, a metal silicide layer such as tungsten silicide ($WSi_x$), a barrier layer such as titanium nitride (TiN), a conductive metal layer such as tungsten (W), and an insulative nitride cap. The nitride barrier layer inhibits passage of boron from the conductive polysilicon layer into the gate oxide layer.

In another aspect, the invention provides a nitride barrier layer. The barrier layer comprises a nitridized silicon layer of about 10 to about 20 angstroms formed on an oxide layer by irradiating the oxide layer with a silicon-containing species under a low partial pressure of about $10^{-2}$ Torr or less, and nitridizing the silicon layer to silicon nitride by exposure to a nitrogen-containing species. In one embodiment, the nitride barrier layer comprises thermally annealed nitridized silicon having a thickness of about 10 to about 20 angstroms, and disposed adjacent an oxide layer. In another embodiment, the nitride barrier layer comprises a plasma nitrogen annealed silicon layer.

In yet another aspect, the invention provides a semiconductor device. The device comprises a semiconductor substrate comprising silicon, an oxide layer disposed adjacent to the semiconductor substrate, and a diffusion barrier layer of about 10 to about 20 angstroms disposed adjacent the oxide layer and comprising a nitridized silicon layer formed by irradiating an oxide layer with a silicon-containing species under low partial pressure of about $10^{-2}$ Torr or less, and nitridizing the silicon to silicon nitride by exposure to a nitrogen-containing species. In one embodiment, the semiconductor device comprises a diffusion barrier layer comprising a thin layer of nitrogen annealed silicon, the silicon being thermally annealed or plasma annealed in a nitrogen-containing species.

In a further aspect, the invention provides a gate electrode. The gate electrode comprises a gate oxide layer disposed adjacent to a semiconductor substrate, typically silicon, and a diffusion barrier layer disposed adjacent the gate oxide layer; the diffusion barrier layer having a thickness of about 10 to about 20 angstroms and comprising a nitridized silicon layer formed by irradiating the gate oxide layer with a silicon-containing species under low partial pressure (about $10^{-2}$ Torr or less), and nitridizing the silicon to silicon nitride by exposure to a nitrogen-containing species. In one embodiment, the diffusion barrier layer of the gate electrode comprises silicon thermally annealed in a nitrogen-containing species. In another embodiment, the gate electrode comprises a diffusion barrier comprising a plasma nitrogen annealed silicon.

The invention advantageously provides an improved interface between a silicon nitride barrier layer and an underlying dielectric (oxide) layer, having less traps and requiring less post treatment (e.g., oxidation) of the gate dielectric. In addition, the invention achieves a relatively thin nitride layer thus decreasing the effective oxide thickness as compared to conventionally used methods.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

An embodiment of a method of the present invention is described with reference to FIGS. 1-4, in a method of forming a gate electrode in a stacked configuration. The gate electrode generally comprises a stack of materials including a gate oxide (dielectric), a conductively doped polysilicon, and can further include a metal silicide layer, a barrier layer, a conductive layer, and an insulative cap.

While the concepts of the invention are conducive to the fabrication of gate electrodes, the concepts described herein can be applied to other semiconductor devices that would likewise benefit from the fabrication of a nitride barrier film as described herein. Therefore, the depiction of the invention in reference to the manufacture of a stacked gate configuration is not meant to limit the extent to which one skilled in the art might apply the concepts taught herein.

Figure 1:
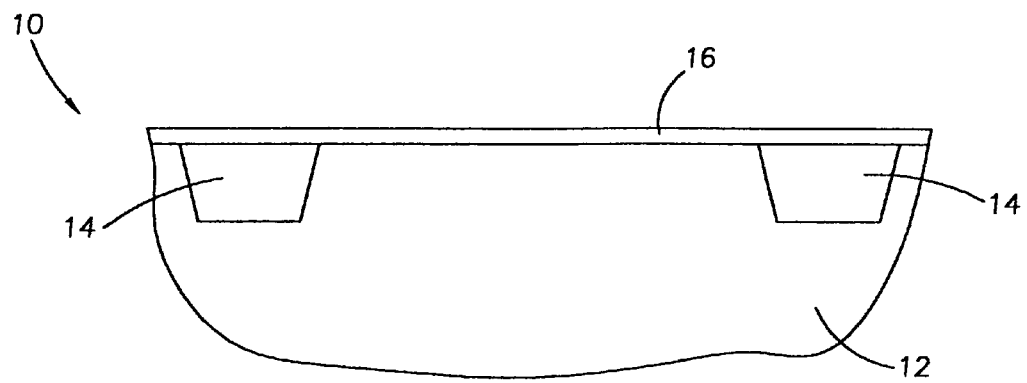
FIG. 1 is a diagrammatic cross-sectional view of a semiconductor wafer fragment at a preliminary step of a processing sequence.

Referring to FIG. 1, a portion of a semiconductor wafer 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices.

The wafer fragment 10 is shown as comprising a semiconductor substrate 12, an exemplary substrate being a bulk substrate material of semiconductive or semiconductor material, for example, monocrystalline silicon. The substrate 12 is provided with isolation regions 14 formed therein, for example, shallow trench isolation regions. A gate oxide (dielectric) layer 16 overlies the substrate 12. The gate oxide layer 16 can comprise, for example, silicon dioxide ($SiO_2$), tantalum pentoxide ($Ta_2O_5$), hafnium dioxide ($HfO_2$), and aluminum trioxide ($Al_2O_3$), among others. The gate oxide layer 16 can be formed by conventional methods, and is typically an oxide layer grown directly on the base silicon substrate material 12, but can also be a deposited layer.

Figure 2:
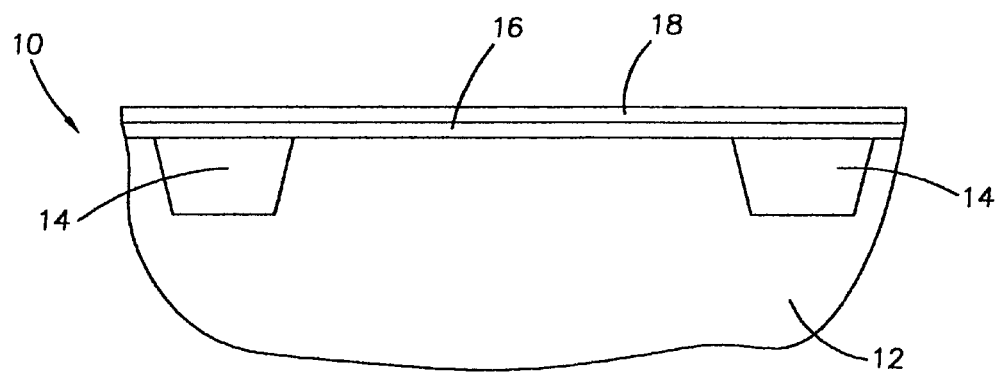
FIGS. 2-4 are views of the wafer fragment of FIG. 1 at subsequent and sequential processing steps, showing fabrication of a nitride barrier layer in a stacked gate electrode according to an embodiment of the method of the invention.

According to the invention, the gate oxide layer 14 is irradiated with a silicon-containing species under low partial pressure, high vacuum conditions to deposit (nucleate) a thin layer 18 of silicon onto the surface 16 of the gate oxide layer 14, as shown in FIG. 2. The silicon layer can comprise polysilicon or amorphous silicon. The processing conditions results in a silicon layer 18 that is thinner than can be achieved under standard silicon growth conditions, i.e., a temperature greater than 600° C., and a pressure greater than 100 mTorr, with $SiH_2$, $Si_2H_7$, or dichlorosilane (DCS, SiH$_2$Cl$_2$). Preferably, the silicon layer 18 is less than about 30 angstroms, preferably about 10 to about 20 angstroms thick. Exemplary silicon source materials include SiH$_2$Cl$_2$, silicon tetrachloride (SiCl$_4$), and a silicon that contains a hydride such as silane (SiH$_4$), and disilane (Si$_2$H$_6$). The silicon material can be deposited as a layer utilizing any known deposition process including plasma enhanced chemical vapor deposition (PECVD), low pressure chemical vapor deposition (LPCVD), and rapid thermal chemical vapor deposition (RTCVD).

Preferably, the silicon material is deposited using a thermal deposition process. Processing conditions include a low partial pressure of about $10^{-2}$ Torr or less, preferably about $10^{-2}$ to about $10^{-7}$ Torr, preferably about $10^{-3}$ to about $10^{-5}$ Torr, a temperature of about 500° C. to ° C. about 700° C., with a flow rate of the silicon-containing species of less than 100 sccm, preferably about 1 sccm to about 50 sccm, for a duration of about 1 second to about 5 minutes.

Figure 3:
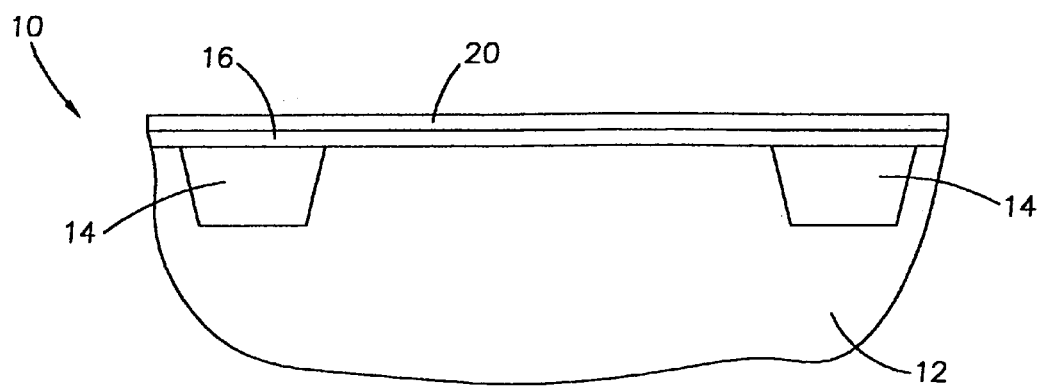

Referring to FIG. 3, the silicon layer 18 is then nitridized to convert the silicon to silicon nitride (SiN$_x$) 20 by exposure to a nitrogen-containing gas using conventional methods. Such conventional methods include a rapid thermal nitridization (RTN), and plasma nitridization, among others. Examples of nitrogen-containing gases for use in such methods include nitrogen (N$_2$), ammonia (NH$_3$), nitrogen trifluoride (NF$_3$), nitrogen oxides (NO$_x$), and an N$_2$/He mixture in plasma. The use of a plasma source of nitrogen-containing gas is preferred.

The nitridation of the silicon layer 18 takes place under conditions that are optimal for nitridation of silicon. An example and preferred rapid thermal nitridization includes exposing the silicon layer to ammonia (NH$_3$) or other nitrogen-containing ambient at a temperature of about 700° C. to about 900° C., a pressure of about 1 to about 760 Torr, with a flow rate of about 100 sccm to about 10,000 sccm, for a duration of about 1 second to about 180 minutes. The partial pressure of the nitrogen-containing ambient can range from a low partial pressure, for example, of about 1 to about 10 Torr, up to full atmospheric pressure to optimize processing as desired.

In a plasma nitridization of the silicon layer 18, the plasma stream can be produced by a variety of plasma sources, such as a downstream microwave system, an electron cyclotron residence (ECR) system, an inductive coupled plasma (ICP) system, a radio frequency (RF) system, among others. Exemplary plasma nitridization processes comprise exposing the wafer 10 to a remote microwave plasma source of nitrogen or an inductive coupled plasma (ICP) at a pressure of about 1 to about 20 Torr. The plasma typically comprises the nitrogen-containing gas, preferably nitrogen (N$_2$) or ammonia (NH$_3$), and an inert gas such as helium or argon to increase the plasma density.

The resulting nitride layer 20 functions as a barrier to inhibit the passage of boron through the gate dielectric layer from an overlying boron-doped gate polysilicon layer into the substrate 12.

Figure 4:
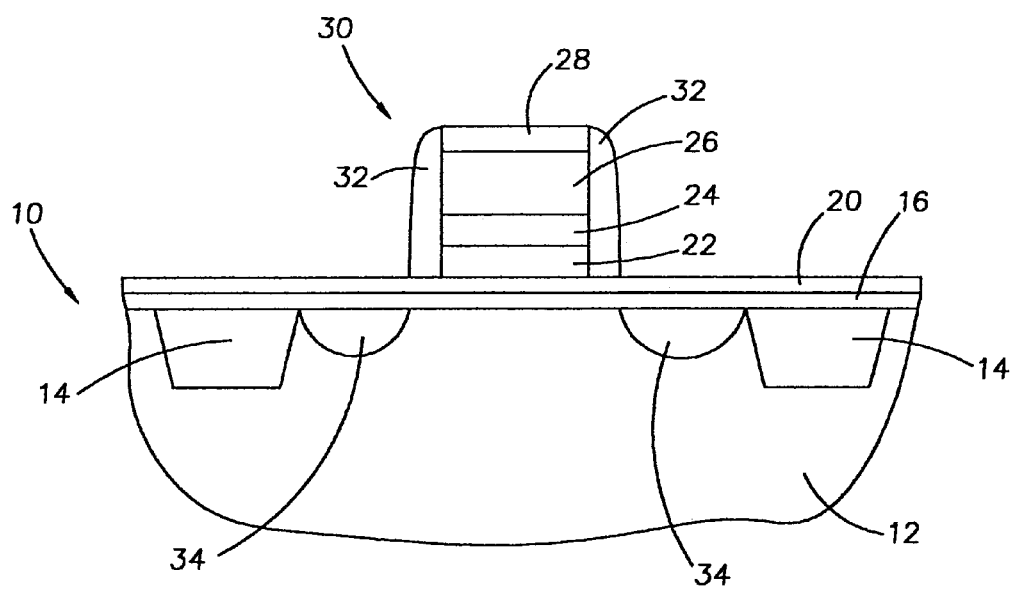

The structure can then be processed by conventional methods to complete the gate electrode. An example of a gate stack comprises a gate oxide layer 16, a doped polysilicon layer 22, a barrier layer 24 such as tungsten nitride (WN), a layer 26 of tungsten or other conductive metal, and a nitride cap 28, as shown in FIG. 4. Another example of a gate stack (not shown) comprises a gate oxide, a doped polysilicon, tungsten silicide (WSi$_x$), titanium silicide (TiSi$_x$), cobalt silicide (CoSi$_x$), and a nitride cap. The gate layers can then be patterned and etched utilizing photolithographic processing (i.e., by dry etching) to form a transistor gate stack 30, as shown. Sidewalls 32 are provided adjacent the transistor gate, and can comprise, for example, silicon dioxide or silicon nitride.

Thereafter, a dopant implantation, typically with an n-type conductivity-enhancing dopant, can be performed to form the source/drain (S/D) regions 34 in the silicon substrate 12 proximate the gate 30. The source/drain regions together with the gate form an operative field effect transistor device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A substrate, comprising:
a dielectric layer over the substrate;
a nitride barrier layer over the dielectric layer, the barrier layer consisting essentially of nitridized and chemical vapor deposited silicon of about 10-20 angstroms, with silicon at an interface with the dielectric layer, and the barrier layer consisting essentially of nitrogen and silicon and effective to inhibit diffusion of a dopant therethrough;
a conductive polysilicon layer over the nitride barrier layer;
a barrier layer over the conductive polysilicon layer;
a conductive metal layer over the barrier layer; and
an insulative layer over the conductive metal layer.

2. A substrate, comprising:
a dielectric layer over the substrate;
a nitride barrier layer over the dielectric layer, the barrier layer consisting essentially of thermally annealed nitridized silicon of about 10-20 angstroms, with silicon at an interface with the dielectric layer, and the barrier layer consisting essentially of nitrogen and silicon and effective to inhibit diffusion of a dopant therethrough;
a conductive polysilicon layer over the nitride barrier layer;
a barrier layer over the conductive polysilicon layer;
a conductive metal layer over the barrier layer; and
an insulative layer over the conductive metal layer.

3. A substrate, comprising:
a dielectric layer over the substrate; and
a nitride barrier layer over the dielectric layer, the barrier layer consisting essentially of plasma nitrogen annealed silicon of about 10-20 angstroms, with silicon at an interface with the dielectric layer, and the barrier layer consisting essentially of nitrogen and silicon and effective to inhibit diffusion of a dopant therethrough.

4. A substrate, comprising:
a nitride barrier layer over a dielectric layer, the barrier layer-consisting essentially of nitridized silicon of about 10-20 angstroms, with silicon at an interface with the dielectric layer, and the barrier layer consisting essentially of nitrogen and silicon and effective to inhibit diffusion of a dopant therethrough;
a conductive polysilicon layer over the nitride barrier layer;

a barrier layer over the conductive polysilicon layer;
a conductive metal layer over the barrier layer; and
an insulative layer over the conductive metal layer.

5. The substrate of claim 4, wherein the conductive layer comprises doped polysilicon, and the nitride barrier layer is effective to inhibit passage of dopant from the polysilicon layer through the nitride barrier layer.

6. The substrate of claim 4, comprising:
a tungsten nitride barrier layer over the conductive polysilicon layer;
a tungsten layer over the barrier layer; and
an insulative layer over the tungsten layer.

7. The substrate of claim 4, further comprising:
a metal silicide layer over the conductive polysilicon layer and the barrier layer comprising an insulative nitride layer over the metal silicide layer.

8. A substrate, comprising:
a nitride barrier layer over a dielectric layer, the barrier layer consisting essentially of nitridized silicon of about 10-20 angstroms, with silicon at an interface with the dielectric layer, and the barrier layer consisting essentially of nitrogen and silicon and effective to inhibit diffusion of a dopant therethrough;
a conductive polysilicon layer over the nitride barrier layer;
a metal silicide layer over the conductive polysilicon layer; and
an insulative layer over the metal silicide layer.

9. A substrate, comprising:
a nitride barrier layer overlying an oxide layer, the nitride barrier layer consisting essentially of nitridized silicon of about 10-20 angstroms, and formed by irradiation of the oxide layer with a silicon gas under low partial pressure, followed by exposure to a nitrogen gas, with silicon at an interface with the dielectric layer, and the barrier layer consisting essentially of nitrogen and silicon and effective to inhibit diffusion of a dopant therethrough;
a doped polysilicon layer overlying the nitride barrier layer;
a metal silicide layer overlying the doped polysilicon layer; and
a nitride cap layer overlying the metal silicide layer.

10. A substrate, comprising:
a nitride barrier layer overlying an oxide layer, the nitride barrier layer consisting essentially of a nitridized silicon layer having a thickness of about 10-20 angstroms, with silicon at an interface with the dielectric layer, and the barrier layer consisting essentially of nitrogen and silicon and effective to inhibit diffusion of a dopant therethrough;
a doped polysilicon layer overlying the nitride barrier layer;
a metal silicide layer overlying the doped polysilicon layer; and
a nitride cap layer overlying the metal suicide layer.

11. A substrate, comprising:
a nitride barrier layer adjacent an oxide layer, the nitride barrier layer consisting essentially of an annealed nitridized silicon layer and having a thickness of about 10-20 angstroms, with silicon at an interface with the dielectric layer, and the barrier layer consisting essentially of nitrogen and silicon and effective to inhibit diffusion of a dopant therethrough;
a doped polysilicon layer overlying the nitride barrier layer;
a metal suicide layer overlying the doped polysilicon layer; and
a nitride cap layer overlying the metal silicide layer.

12. The substrate of claim 11, wherein the barrier layer is thermally annealed.

13. The substrate of claim 11, wherein the barrier layer is plasma annealed.

14. A substrate, comprising:
a barrier layer overlying a dielectric layer, the barrier layer consisting essentially of nitridized and chemical vapor deposited silicon, and having a thickness of about 10-20 angstroms, with silicon at an interface with the dielectric layer, and the barrier layer consisting essentially of nitrogen and silicon and effective to inhibit diffusion of a dopant therethrough;
a doped polysilicon layer overlying the barrier layer;
a metal suicide layer overlying the doped polysilicon layer; and
a barrier layer overlying the metal silicide layer.

15. A substrate, comprising:
a barrier layer in contact with overlying a dielectric layer, the barrier layer consisting essentially of thermally annealed nitridized silicon, and having a thickness of about 10-20 angstroms, with silicon at an interface and in contact with the dielectric layer, and the barrier layer consisting essentially of nitrogen and silicon and effective to inhibit diffusion of a dopant therethrough;
a doped polysilicon layer overlying the barrier layer;
a metal suicide layer overlying the doped polysilicon layer; and
a barrier layer overlying the metal suicide layer.

16. A substrate, comprising: a barrier layer overlying a dielectric layer, the barrier layer consisting essentially of plasma nitrogen annealed silicon of about 10-20 angstroms, with silicon at an interface with the dielectric layer, and the barrier layer consisting essentially of nitrogen and silicon and effective to inhibit diffusion of a dopant therethrough.

17. A substrate, comprising:
a diffusion barrier layer in a semiconductor device, the diffusion barrier layer consisting essentially of nitridized and chemical vapor deposited silicon on a dielectric layer, and having a thickness of about 10-20 angstroms, with silicon at an interface with the dielectric layer, and the barrier layer consisting essentially of nitrogen and silicon and effective to inhibit diffusion of a dopant therethrough;
a doped polysilicon layer overlying the barrier layer;
a metal silicide layer overlying the doped polysilicon layer;
a barrier layer overlying the metal silicide layer;
a conductive metal layer overlying the barrier layer; and
a nitride cap layer overlying the conductive metal layer.

18. A substrate, comprising:
a diffusion barrier layer in a semiconductor device, the diffusion barrier layer consisting essentially of thermally annealed nitridized silicon on a dielectric layer, and said thermally nitrogen annealed silicon having a thickness of about 10-20 angstroms, wherein silicon is at an interface with the dielectric layer, and the barrier layer consisting essentially of nitrogen and silicon and effective to inhibit diffusion of a dopant therethrough;
a doped polysilicon layer overlying the barrier layer;
a metal silicide layer overlying the doped polysilicon layer;
a barrier layer overlying the metal silicide layer;
a conductive metal layer overlying the barrier layer; and
a nitride cap layer overlying the conductive metal layer.

19. A substrate, comprising: a diffusion barrier layer in a semiconductor device, the diffusion barrier layer consisting essentially of plasma nitrogen annealed silicon on a dielectric layer, said plasma nitrogen annealed silicon having a thickness of about 10-20 angstroms with silicon at an interface with the dielectric layer, and the barrier layer consisting essentially of nitrogen and silicon and effective to inhibit diffusion of a dopant therethrough.

20. A substrate, comprising:
a diffusion barrier layer on an oxide layer, the diffusion barrier layer consisting essentially of a nitridized silicon layer having a thickness of about 10-20 angstroms, with silicon at an interface with the oxide layer, and the barrier layer consisting essentially of nitrogen and silicon and effective to inhibit diffusion of a dopant therethrough;
a doped polysilicon layer overlying the barrier layer;
a metal suicide layer overlying the doped polysilicon layer;
a barrier layer overlying the metal silicide layer;
a conductive metal layer overlying the barrier layer; and
a nitride cap layer overlying the conductive metal layer.

21. A substrate, comprising:
a diffusion barrier layer over an oxide layer, the diffusion barrier layer consisting essentially of nitridized silicon having a thickness of about 10-20 angstroms, with silicon at an interface with the oxide layer, and the barrier layer consisting essentially of nitrogen and silicon and effective to inhibit diffusion of a dopant therethrough;
a doped polysilicon layer overlying the barrier layer;
a metal silicide layer overlying the doped polysilicon layer; and
a barrier layer overlying the metal silicide layer.

22. A substrate, comprising:
a diffusion barrier layer on an oxide layer, the barrier layer consisting essentially of nitrogen annealed silicon having a thickness of about 10-20 angstroms, with silicon at an interface with the oxide layer, and the barrier layer consisting essentially of nitrogen and silicon and effective to inhibit diffusion of a dopant therethrough;
a doped polysilicon layer overlying the barrier layer;
a metal silicide layer overlying the doped polysilicon layer; and
a barrier layer overlying the metal silicide layer.

23. The substrate of claim 22, wherein the diffusion barrier layer consists essentially of plasma annealed silicon.

24. The substrate of claim 22, wherein the diffusion barrier layer consists essentially of thermally annealed silicon.

25. A substrate, comprising:
a diffusion barrier layer of about 10-20 angstroms on a dielectric layer, the diffusion barrier layer consisting essentially of nitridized and chemical vapor deposited silicon, with silicon at an interface with the dielectric layer, and the barrier layer consisting essentially of nitrogen and silicon and effective to inhibit diffusion of a dopant therethrough;
a doped polysilicon layer overlying the barrier layer;
a metal silicide layer overlying the doped polysilicon layer; and
a nitride cap layer overlying the metal silicide layer.

26. A substrate, comprising: a diffusion barrier layer of about 10-20 angstroms on a dielectric layer, the diffusion barrier layer consisting essentially of plasma nitrogen annealed silicon, with silicon at an interface with the dielectric layer, and the barrier layer consisting essentially of nitrogen and silicon and effective to inhibit diffusion of a dopant therethrough.

27. A substrate, comprising:
a diffusion barrier layer of about 10-20 angstroms on a dielectric layer, the diffusion barrier layer consisting essentially of thermally annealed nitridized silicon, with silicon at an interface with the dielectric layer, and the barrier layer consisting essentially of nitrogen and silicon and effective to inhibit diffusion of a dopant therethrough;
a doped polysilicon layer overlying the barrier layer;
a metal suicide layer overlying the doped polysilicon layer; and
a barrier layer overlying the metal silicide layer.

* * * * *

UNITED STATES PATENT AND TRADEMARK OFFICE
CERTIFICATE OF CORRECTION

PATENT NO. : 7,247,920 B2 Page 1 of 1
APPLICATION NO. : 10/931840
DATED : July 24, 2007
INVENTOR(S) : Ronald W. Weimer It is certified that error appears in the above-identified patent and that said Letters Patent is hereby corrected as shown below:

Column 7, line 57, replace "suicide" with --silicide--.
Column 8, line 1, replace "suicide" with --silicide--.
Column 8, line 17, replace "suicide" with --silicide--.
Column 8, line 22, after "layer", delete "in contact with".
Column 8, line 29, replace "suicide" with --silicide--.
Column 8, line 31, replace "suicide" with --silicide--.
Column 9, line 18, replace "suicide" with --silicide--.
Column 10, line 38, replace "suicide" with --silicide--.

Signed and Sealed this

Thirteenth Day of November, 2007

JON W. DUDAS
*Director of the United States Patent and Trademark Office*